(12) United States Patent
Tan et al.

(10) Patent No.: US 11,239,364 B2
(45) Date of Patent: Feb. 1, 2022

(54) SEMICONDUCTOR DEVICE AND METHOD FOR MANUFACTURING THE SAME

(71) Applicant: Shanghai Huali Integrated Circuit Corporation, Shanghai (CN)

(72) Inventors: Jun Tan, Shanghai (CN); Qiuming Huang, Shanghai (CN); Qiang Yan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/890,551

(22) Filed: Jun. 2, 2020

(65) Prior Publication Data
US 2021/0036153 A1 Feb. 4, 2021

(30) Foreign Application Priority Data
Jul. 30, 2019 (CN) .......................... 201910695548.5

(51) Int. Cl.
*H01L 29/78* (2006.01)
*H01L 29/08* (2006.01)
(Continued)

(52) U.S. Cl.
CPC ...... *H01L 29/7848* (2013.01); *H01L 29/0847* (2013.01); *H01L 29/4236* (2013.01);
(Continued)

(58) Field of Classification Search
CPC ......... H01L 29/06; H01L 29/51; H01L 29/66; H01L 29/08; H01L 29/78; H01L 29/423; H01L 29/518; H01L 29/517; H01L 29/0607; H01L 29/7848; H01L 29/66613; H01L 29/66636; H01L 29/66621; H01L 29/0847; H01L 29/4236; H01L 29/42356; H01L 29/12; H01L 29/49; H01L 29/165; H01L 29/4966; H01L 29/66545; H01L 29/66583; H01L 29/7843; H01L 29/66689; H01L 29/66492; H01L 29/665; H01L 29/6653; H01L 29/6659; H01L 29/7816; H01L 29/7833; H01L 29/4916; H01L 21/823864; H01L 21/823814; H01L 21/76; H01L 21/8238; H01L 21/28;
(Continued)

(56) References Cited

U.S. PATENT DOCUMENTS

2011/0189845 A1* 8/2011 Yamakawa ......... H01L 29/7848
438/589

* cited by examiner

*Primary Examiner* — Chuong A Luu
(74) *Attorney, Agent, or Firm* — Banner & Witcoff, Ltd.

(57) ABSTRACT

The present disclosure discloses a semiconductor device, which comprises: an embedded gate structure with a bottom embedded in a semiconductor substrate; a channel region formed below the bottom surface of the embedded gate structure; a source region and a drain region formed on the two sides of the embedded gate structure; an embedded epitaxial layer formed in the source region or the drain region, the bottom surface of the embedded gate structure being in flush with the maximum stress position of the embedded epitaxial layer. The present disclosure further discloses a method for manufacturing a semiconductor device. The present disclosure can enable the channel region to be located in the maximum stress region of the embedded epitaxial layer, thereby improving the mobility of channel carriers to the utmost extent and improving the conduction current of the device.

12 Claims, 4 Drawing Sheets

(51) Int. Cl.
*H01L 29/423* (2006.01)
*H01L 29/66* (2006.01)
*H01L 29/51* (2006.01)

(52) U.S. Cl.
CPC .. *H01L 29/66621* (2013.01); *H01L 29/66636* (2013.01); *H01L 29/517* (2013.01); *H01L 29/518* (2013.01)

(58) Field of Classification Search
CPC ....... H01L 21/28088; H01L 21/823842; H01L 21/823807; H01L 21/823828; H01L 21/66613; H01L 21/66636; H01L 21/66621; H01L 21/0847; H01L 21/4236; H01L 21/42356
USPC .......................................................... 257/411
See application file for complete search history.

SEMICONDUCTOR DEVICE AND METHOD FOR MANUFACTURING THE SAME

CROSS REFERENCE TO RELATED APPLICATIONS

The present application claims priority to and the benefit of Chinese Patent Application No. CN 201910695548.5 filed on Jul. 30, 2019, the disclosure of which is incorporated herein by reference in its entirety as part of the present application.

TECHNICAL FIELD

The present disclosure relates to the field of semiconductor integrated circuit manufacturing, in particular to a semiconductor device. The present disclosure further relates to a method for manufacturing a semiconductor device.

BACKGROUND

With the development of integrated circuits, the field effect size is getting smaller and smaller. In semiconductor manufacturing, a stress technology is introduced to change the lattice structure in the channel, so as to improve the mobility of carriers in the channel. According to the existing study, applying tensile stress to the channel can improve the mobility of electrons, while applying compressive stress can improve the mobility of holes. Embedded silicon germanium (SiGe) epitaxial layer is widely used to improve the performance of PMOS. The embedded SiGe epitaxial layer can apply compressive stress to the channel region by embedding the SiGe epitaxial layer material in the source region or drain region of PMOS, thereby significantly improving the performance of PMOS. Generally, the higher the stress is, the higher the mobility of channel carriers is. However, in the traditional process, the PMOS channel is not in the maximum stress area of SiGe. Similarly, for NMOS transistors, the mobility of channel carriers can also be improved through the embedded epitaxial layer.

BRIEF SUMMARY

The technical problem to be solved by the present disclosure is to provide a semiconductor device. A source region or a drain region has an embedded epitaxial layer providing stress for a channel region, so that the channel region is located in the maximum stress area of the embedded epitaxial layer, thereby improving the mobility of channel carriers to the utmost extent.

In order to solve the above technical problem, the semiconductor device provided by the present disclosure comprises:

an embedded gate structure with a bottom embedded in a semiconductor substrate;

a channel region formed below the bottom surface of the embedded gate structure, the surface of the channel region covered by the bottom surface of the embedded gate structure being used to form a channel;

a source region and a drain region formed on the two sides of the embedded gate structure;

an embedded epitaxial layer formed in the source region or the drain region, the embedded epitaxial layer being used to provide stress for the channel region, the maximum stress position of the embedded epitaxial layer being located below the surface of the semiconductor substrate, and the bottom surface of the embedded gate structure being in flush with the maximum stress position of the embedded epitaxial layer so that the channel region is subjected to the maximum stress and the mobility of channel carriers is improved.

As a further improvement, the semiconductor substrate is a silicon substrate.

As a further improvement, the embedded gate structure comprises a gate dielectric layer and a gate conducting material layer which are sequentially superposed;

The embedded gate structure is divided into an embedded part embedded in the semiconductor substrate and a protruding part located on the surface of the semiconductor substrate.

The embedded part of the embedded gate structure consists of the gate dielectric layer formed on the bottom surface and the side surfaces of a first groove and the gate conducting material layer filled in the first groove, and the protruding part of the embedded gate structure is formed by the gate dielectric layer and the gate conducting material layer extending from the first groove to the surface of the semiconductor substrate.

As a further improvement, sidewalls are formed on the two sides of the protruding part of the embedded gate structure.

As a further improvement, the embedded epitaxial layer is formed in a second groove, the cross section of the second groove is in a Σ shape and the maximum stress position of the embedded epitaxial layer is located at the sharp corner of the Σ shape of the cross section of the second groove.

As a further improvement, the semiconductor device is a PMOS transistor and the material of the embedded epitaxial layer is SiGe.

As a further improvement, the cross section of the first groove is rectangular.

As a further improvement, the material of the gate dielectric layer is silicon oxide; or the material of the gate dielectric layer is silicon oxynitride; or the material of the gate dielectric layer comprises a high-dielectric-constant material, and the high-dielectric-constant material comprises hafnium dioxide.

The material of the gate conducting material layer is polysilicon; or the material of the gate conducting material layer is metal.

In order to solve the above technical problem, the method for manufacturing the semiconductor device provided by the present disclosure comprises the following steps:

step 1: providing a semiconductor substrate; etching the semiconductor substrate in the forming area of an embedded gate structure to form a first groove, the bottom surface of the first groove being arranged below the maximum stress position of a subsequently formed embedded epitaxial layer; and filling a first dielectric layer in the first groove;

step 2: forming a second groove in the forming area of a source region or a drain region on the two sides of the embedded gate structure, and filling the embedded epitaxial layer in the second groove;

step 3: removing the first dielectric layer;

step 4: filling the first epitaxial layer in the first groove to raise the bottom surface of the first groove to be in flush with the maximum stress position of the embedded epitaxial layer;

step 5: sequentially forming a gate dielectric layer and a gate conducting material layer, the embedded gate structure comprising a structure formed by superposing the gate dielectric layer and the gate conducting material layer.

The embedded gate structure is divided into an embedded part embedded in the semiconductor substrate and a protruding part located on the surface of the semiconductor substrate; the embedded part of the embedded gate structure consists of the gate dielectric layer formed on the bottom surface and the side surfaces of the first groove and the gate conducting material layer filled in the first groove, and the protruding part of the embedded gate structure is formed by the gate dielectric layer and the gate conducting material layer extending from the first groove to the surface of the semiconductor substrate.

A channel region is formed below the bottom surface of the embedded gate structure, and the surface of the channel region covered by the bottom surface of the embedded gate structure is used to form a channel; the embedded epitaxial layer is used to provide stress for the channel region, and a structure that the bottom surface of the embedded gate structure is in flush with the maximum stress position of the embedded epitaxial layer enables the channel region to be subjected to the maximum stress and the mobility of channel carriers to be improved.

As a further improvement, the semiconductor substrate is a silicon substrate.

As a further improvement, after step 5 is completed, the method for manufacturing the semiconductor device further comprises the following steps:

forming sidewalls on the two sides of the protruding part of the embedded gate structure;

performing source and drain implantation in the forming area of the source region and the drain region on the two sides of the embedded gate structure to form the source region and the drain region.

As a further improvement, the cross section of the second groove is in a Σ shape and the maximum stress position of the embedded epitaxial layer is located at the sharp corner of the Σ shape of the cross section of the second groove.

As a further improvement, the semiconductor device is a PMOS transistor and the material of the embedded epitaxial layer is SiGe.

As a further improvement, the cross section of the first groove is rectangular.

As a further improvement, the material of the gate dielectric layer is silicon oxide; or the material of the gate dielectric layer is silicon oxynitride; or the material of the gate dielectric layer comprises a high-dielectric-constant material, and the high-dielectric-constant material comprises hafnium dioxide.

The material of the gate conducting material layer is polysilicon; or the material of the gate conducting material layer is metal.

The present disclosure also arranges the gate structure of the semiconductor device as the embedded structure, that is, the present disclosure adopts the embedded gate structure. The bottom surface of the embedded gate structure can be adjusted to adjust the surface position of the channel region. The present disclosure adjusts the bottom surface of the embedded gate structure to be in flush with the maximum stress position of the embedded epitaxial layer, so that the channel region is subjected to the maximum stress, the mobility of channel carriers is improved and the mobility of channel carriers can be improved to the utmost extent, thereby improving the conduction current of the device and improving the performance of the device.

BRIEF DESCRIPTION OF THE DRAWINGS

The present disclosure will be further described below in detail with reference to the drawings in combination with the specific embodiments.

DETAILED DESCRIPTION

Figure 1:
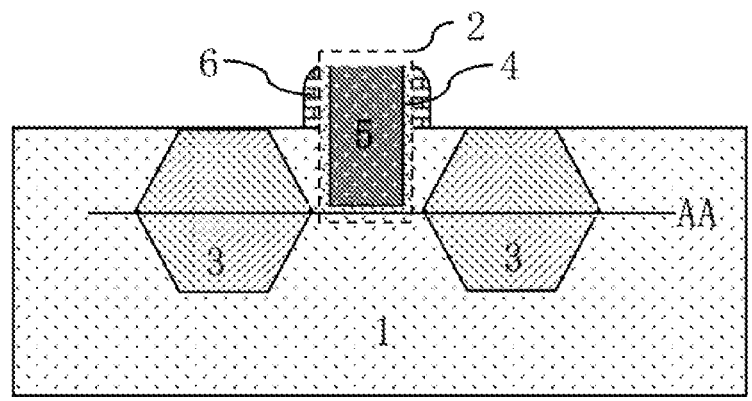
FIG. 1 is a structural schematic view of a semiconductor device according to one embodiment of the present disclosure.

FIG. 1 is a structural schematic view of a semiconductor device according to one embodiment of the present disclosure. The semiconductor device according to the embodiment of the present disclosure comprises:

an embedded gate structure 2 with a bottom embedded in a semiconductor substrate 1.

The semiconductor substrate 1 is a silicon substrate. In other embodiments, the material of the semiconductor substrate 1 may also be other semiconductor materials in addition to silicon.

The embedded gate structure 2 comprises a gate dielectric layer 4 and a gate conducting material layer 5 which are sequentially superposed.

The embedded gate structure 2 is divided into an embedded part embedded in the semiconductor substrate 1 and a protruding part located on the surface of the semiconductor substrate 1.

The embedded part of the embedded gate structure 2 consists of the gate dielectric layer 4 formed on the bottom surface and the side surfaces of a first groove 102 and the gate conducting material layer 5 filled in the first groove 102. For the first groove 102, please refer to FIG. 2A. The protruding part of the embedded gate structure 2 is formed by the gate dielectric layer 4 and the gate conducting material layer 5 extending from the first groove 102 to the surface of the semiconductor substrate 1.

The cross section of the first groove 102 is rectangular.

The material of the gate dielectric layer 4 comprises a high-dielectric-constant material, and the high-dielectric-constant material comprises hafnium dioxide. In other embodiments, the material of the gate dielectric layer 4 may be silicon oxide; or the material of the gate dielectric layer 4 may be silicon oxynitride.

The material of the gate conducting material layer 5 is metal, such as aluminum or tungsten. When the material of the gate conducting material layer 5 is Al, a TiN or TaN layer is generally formed between the gate dielectric layer 4 and Al. In other embodiments, the material of the gate conducting material layer 5 may be polysilicon.

Sidewalls 6 are formed on the two sides of the protruding part of the embedded gate structure 2. The material of the sidewalls 6 comprises silicon oxide, silicon nitride or silicon oxynitride.

A channel region is formed below the bottom surface of the embedded gate structure 2, and the surface of the channel region covered by the bottom surface of the embedded gate structure 2 is used to form a channel.

A source region and a drain region are formed on the two sides of the embedded gate structure 2.

An embedded epitaxial layer 3 formed in the source region or the drain region, the embedded epitaxial layer 3 is used to provide stress for the channel region, the maximum stress position of the embedded epitaxial layer 3 is located below the surface of the semiconductor substrate 1, and the bottom surface of the embedded gate structure 2 is in flush with the maximum stress position of the embedded epitaxial layer 3 so that the channel region is subjected to the maximum stress and the mobility of channel carriers is improved. Center line AA in FIG. 1 represents the maximum stress position of the embedded epitaxial layer 3 and the bottom surface position of the embedded gate structure 2.

The embedded epitaxial layer 3 is formed in a second groove 105. For the second groove 105, please refer to FIG. 2C. The cross section of the second groove 105 is in a Σ shape and the maximum stress position of the embedded epitaxial layer 3 is located at the sharp corner of the Σ shape of the cross section of the second groove 105.

In the embodiment of the present disclosure, the semiconductor device is a PMOS transistor and the material of the embedded epitaxial layer 3 is SiGe. In other embodiments, the semiconductor device may be an NMOS transistor, and the material of the embedded epitaxial layer 3 may be a material different from SiGe, such as SiP, so as to ensure that the tensile stress can be produced towards the groove region.

The embodiment of the present disclosure also arranges the gate structure of the semiconductor device as the embedded structure, that is, the embodiment of the present disclosure adopts the embedded gate structure 2. The bottom surface of the embedded gate structure 2 can be adjusted to adjust the surface position of the channel region. The embodiment of the present disclosure adjusts the bottom surface of the embedded gate structure 2 to be in flush with the maximum stress position of the embedded epitaxial layer 3, so that the channel region is subjected to the maximum stress, the mobility of channel carriers is improved and the mobility of channel carriers can be improved to the utmost extent, thereby improving the performance of the device.

Figure 2A:
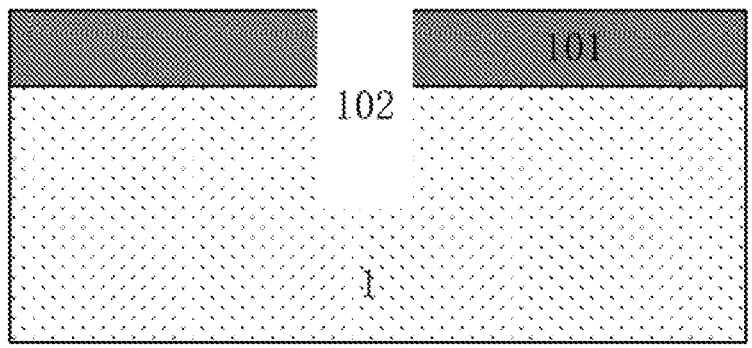
FIG. 2A to FIG. 2I are structural schematic views of devices in each step of a method for manufacturing a semiconductor device according to one embodiment of the present disclosure.

FIG. 2A to FIG. 2I are structural schematic views of devices in each step of a method for manufacturing a semiconductor device according to one embodiment of the present disclosure. The method for manufacturing the semiconductor device according to the embodiment of the present disclosure comprises the following steps:

In step 1, as illustrated in FIG. 2A, a semiconductor substrate 1 is provided; the semiconductor substrate 1 in the forming area of an embedded gate structure 2 is etched to form a first groove 102, wherein the bottom surface of the first groove 102 is arranged below the maximum stress position of a subsequently formed embedded epitaxial layer 3.

Figure 2B:
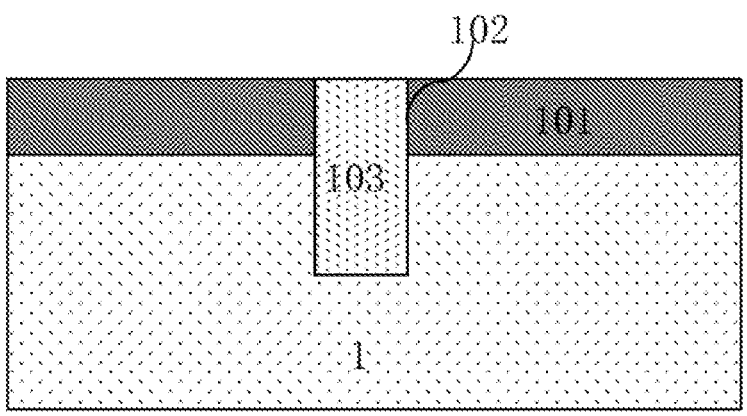

As illustrated in FIG. 2B, a first dielectric layer 103 is filled in the first groove 102.

The semiconductor substrate 1 is a silicon substrate. In other embodiments, the material of the semiconductor substrate 1 may also be other semiconductor materials in addition to silicon.

The cross section of the first groove 102 is rectangular.

In the method according to the embodiment of the present disclosure, a hard mask layer 101 is used when the first groove 102 is formed, and the step of forming the first groove 102 comprise the following sub-steps:

Firstly, the hard mask layer 101 is formed on the surface of the semiconductor substrate 1. The material of the hard mask layer 101 comprises SiN or SiON, which may be deposited and formed by adopting a CVD or furnace tube process. The material of the first dielectric layer 103 is oxide.

Then, lithography is performed to define the first groove 102, i.e., the forming area of the embedded gate structure 2.

Then, the hard mask layer 101 and the semiconductor substrate 1 are sequentially etched to form the first groove 102.

Figure 2C:
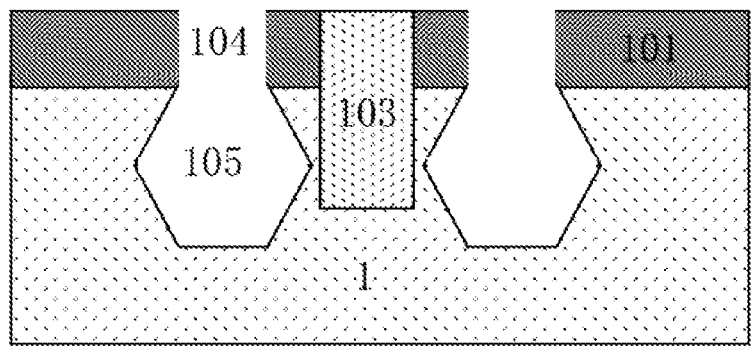

In step 2, a second groove 105 is formed in the forming area of a source region or a drain region on the two sides of the embedded gate structure 2. In the method according to the embodiment of the present disclosure, the step of forming the second groove 105 comprises the following sub-steps:

As illustrated in FIG. 2C, lithography is performed to open the forming area of the second groove 105.

Then, the hard mask layer 101 is etched to form an opening 104.

The semiconductor substrate 1 at the bottom of the opening is continuously etched to form the second groove 105. The cross section of the second groove 105 is in a Σ shape.

Figure 2D:
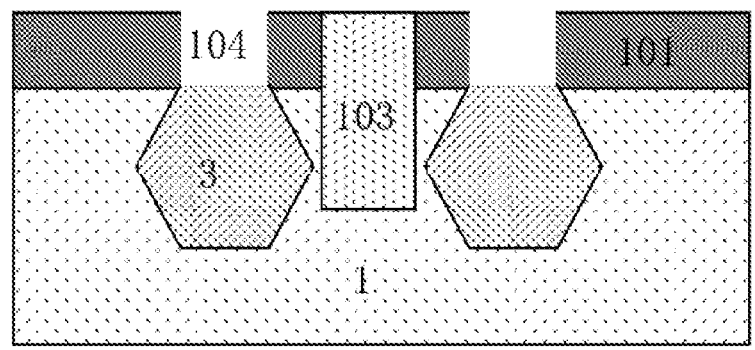

After the second groove 105 is formed, as illustrated in FIG. 2D, the embedded epitaxial layer 3 is filled in the second groove 105, i.e., an epitaxial growth process is adopted to form the embedded epitaxial layer 3 filled in the second groove 105.

The maximum stress position of the embedded epitaxial layer 3 is located at the sharp corner of the Σ shape of the cross section of the second groove 105.

In the method according to the embodiment of the present disclosure, the semiconductor device is a PMOS transistor and the material of the embedded epitaxial layer 3 is SiGe. In the method according to other embodiments, the semiconductor device may be an NMOS transistor, and the material of the embedded epitaxial layer 3 may be a material different from SiGe, such as SiP, so as to ensure that the tensile stress can be produced towards the groove region.

In step 3, the first dielectric layer 103 is removed.

Figure 2E:
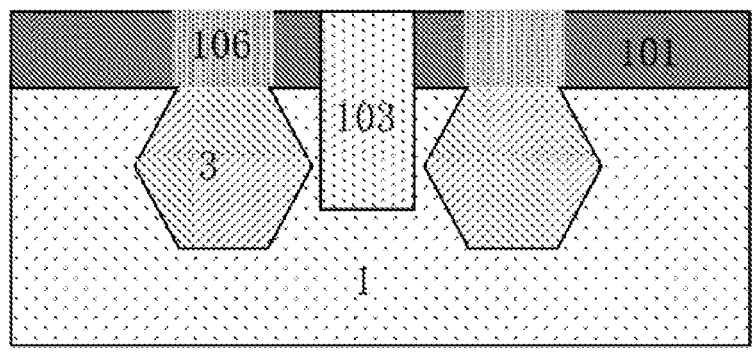

In the method of the embodiment of the present disclosure, as illustrated in FIG. 2E, the method further comprises the step of filling a protective layer 106 in the opening 104 before the step of removing the first dielectric layer 103. The material of the protective layer 106 comprises SiN or SiON, which may be deposited and formed by adopting a CVD or furnace tube process.

Figure 2F:
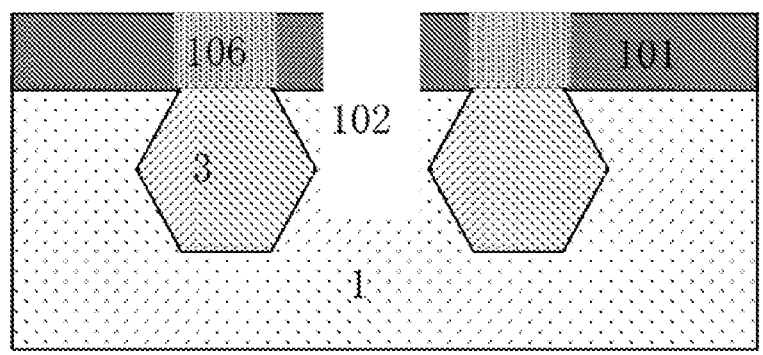

Then, as illustrated in FIG. 2F, the first dielectric layer 103 is removed.

Figure 2G:
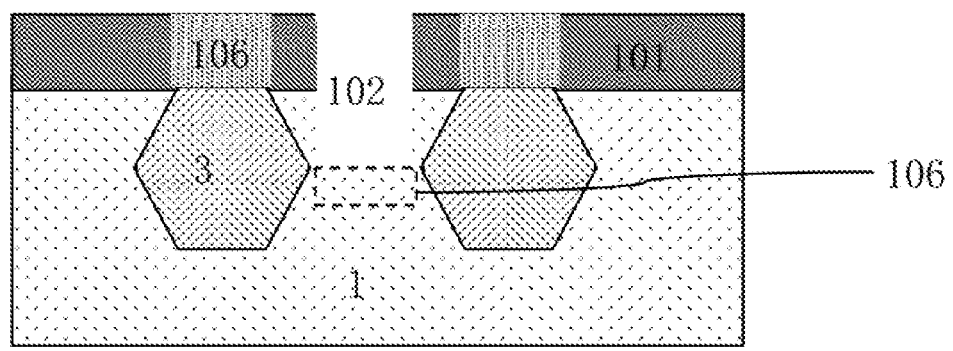

In step 4, as illustrated in FIG. 2G, the first epitaxial layer is filled in the first groove 2 to raise the bottom surface of the first groove 102 to be in flush with the maximum stress position of the embedded epitaxial layer 3. In FIG. 2G, the first epitaxial layer is as illustrated in the dashed line frame 106. The material of the first epitaxial layer 106 is the same as that of the first semiconductor substrate 1. The doping type of the first epitaxial layer 106 is the same as that of the semiconductor substrate 1. The doping concentration of the first epitaxial layer 106 may be the same as or different from that of the semiconductor substrate 1. In FIG. 2G, the formed first epitaxial layer 106 acts as a part of the semiconductor substrate 1. The first epitaxial layer 106 may also be formed by adopting non-doping epitaxial growth.

In step 5, a gate dielectric layer 4 and a gate conducting material layer 5 are sequentially formed. The embedded gate structure 2 comprises a structure formed by superposing the gate dielectric layer 4 and the gate conducting material layer 5.

Figure 2H:
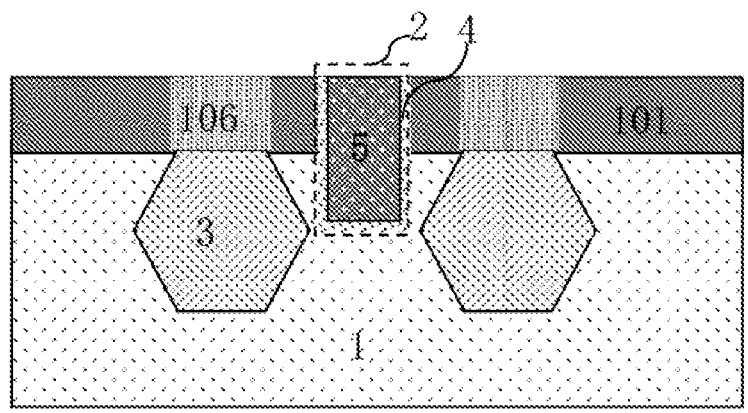

As illustrated in FIG. 2H, in the method according to the embodiment of the present disclosure, the gate dielectric layer 4 and the gate conducting material layer 5 are grown under the condition that the protective layer 106 and the hard mask layer 101 are reserved.

The material of the gate dielectric layer 4 comprises a high-dielectric-constant material, the high-dielectric-constant material comprises hafnium dioxide, and hafnium dioxide is usually formed by adopting an ALD process. In other embodiments, the material of the gate dielectric layer 4 may also be silicon oxide, and silicon oxide may be formed by adopting an oxidation process or In-Situ Seat Generation (ISSG) process; or the material of the gate dielectric layer 4 is silicon oxynitride.

The material of the gate conducting material layer 5 is metal, such as aluminum or tungsten. When the material of the gate conducting material layer 5 is Al, a TiN or TaN layer is generally formed between the gate dielectric layer 4 and Al. Generally, TiN, TaN and Al are formed by adopting a PVD process. In the method according to other embodiments, the material of the gate conducting material layer 5 may be polysilicon.

Figure 2I:
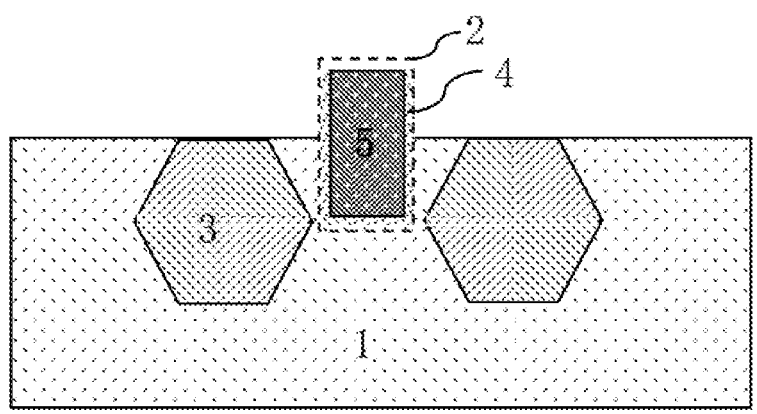

Then, as illustrated in FIG. 2I, the protective layer 106 and the hard mask layer 101 are removed.

After the protective layer 106 and the hard mask layer 101 are removed, the embedded gate structure 2 is divided into an embedded part embedded in the semiconductor substrate 1 and a protruding part located on the surface of the semiconductor substrate 1; the embedded part of the embedded gate structure 2 consists of the gate dielectric layer 4 formed on the bottom surface and the side surfaces of the first groove 102 and the gate conducting material layer 5 filled in the first groove 102, and the protruding part of the embedded gate structure 2 is formed by the gate dielectric layer 4 and the gate conducting material layer 5 extending from the first groove 102 to the surface of the semiconductor substrate 1.

A channel region is formed below the bottom surface of the embedded gate structure 2, and the surface of the channel region covered by the bottom surface of the embedded gate structure 2 is used to form a channel; the embedded epitaxial layer 3 is used to provide stress for the channel region, and a structure that the bottom surface of the embedded gate structure 2 is in flush with the maximum stress position of the embedded epitaxial layer 3 enables the channel region to be subjected to the maximum stress and the mobility of channel carriers to be improved.

After step 5 is completed, the method further comprises the following step:

Sidewalls 6 are formed on the two sides of the protruding part of the embedded gate structure 2. The material of the sidewalls 6 comprises silicon oxide, silicon nitride or silicon oxynitride.

Source and drain implantation is performed in the forming area of the source region and the drain region on the two sides of the embedded gate structure 2 to form the source region and the drain region.

The present disclosure has been described above in detail through specific embodiments, but these embodiments do not constitute limitations to the present disclosure. Without departing from the principle of the present disclosure, one skilled in the art may also make many variations and improvements, which should also be regarded as included in the protection scope of the present disclosure.

What is claimed is:

1. A semiconductor device, wherein the semiconductor device comprises:
    an embedded gate structure with a bottom embedded in a semiconductor substrate;
    a channel region formed below a bottom surface of the embedded gate structure, a surface of the channel region covered by the bottom surface of the embedded gate structure being used to form a channel;
    a source region and a drain region formed on two sides of the embedded gate structure; and
    an embedded epitaxial layer formed in the source region or the drain region, the embedded epitaxial layer being used to provide stress for the channel region, a maximum stress position of the embedded epitaxial layer being located below a surface of the semiconductor substrate, and the bottom surface of the embedded gate structure being in flush with the maximum stress position of the embedded epitaxial layer so that the channel region is subjected to a maximum stress and a mobility of channel carriers is improved,
    wherein the embedded gate structure comprises a gate dielectric layer and a gate conducting material layer which are sequentially superposed,
    the embedded gate structure is divided into an embedded part embedded in the semiconductor substrate and a protruding part located on the surface of the semiconductor substrate,
    the embedded part of the embedded gate structure consists of the gate dielectric layer formed on a bottom surface and side surfaces of a first groove and the gate conducting material layer filled in the first grove, and the protruding part of the embedded gate structure is formed by the gate dielectric layer and the gate conducting material layer extending from the first groove to the surface of the semiconductor substrate,
    the embedded epitaxial layer is formed in a second groove, a cross section of the second groove in a Σ shape and the maximum stress position of the embedded epitaxial layer is located at a sharp corner of the Σ shape of the cross section of the second groove, and
    the first groove is also filled with a first epitaxial layer, the first epitaxial layer is located at the bottom of the embedded gate structure, and the first epitaxial layer raises the bottom surface of the first groove to be in flush with the maximum stress position of the embedded epitaxial layer.

2. The semiconductor device according to claim 1, wherein the semiconductor substrate is a silicon substrate.

3. The semiconductor device according to claim 1, wherein sidewalls are formed on two sides of the protruding part of the embedded gate structure.

4. The semiconductor device according to claim 1, wherein the semiconductor device is a PMOS transistor and a material of the embedded epitaxial layer is SiGe.

5. The semiconductor device according to claim 1, wherein a cross section of the first groove is rectangular.

6. The semiconductor device according to claim 1, wherein a material of the gate dielectric layer is silicon oxide; or the material of the gate dielectric layer is silicon oxynitride; or the material of the gate dielectric layer comprises a high-dielectric-constant material, and the high-dielectric-constant material comprises hafnium dioxide; and
    a material of the gate conducting material layer is polysilicon; or the material of the gate conducting material layer is metal.

7. A method for manufacturing a semiconductor device, wherein the method for manufacturing the semiconductor device comprises the following steps:
    step 1: providing a semiconductor substrate; etching the semiconductor substrate in a forming area of an embedded gate structure to form a first groove, a bottom surface of the first groove being arranged below a maximum stress position of a subsequently formed embedded epitaxial layer; and filling a first dielectric layer in the first groove;
    step 2: forming a second groove in the forming area of a source region or a drain region on two sides of the embedded gate structure, and filling the embedded epitaxial layer in the second groove, wherein a cross section of the second groove in a Σ shape and the maximum stress position of the embedded epitaxial layer is located at a sharp corner of the Σ shape of the cross section of the second groove;

step 3: removing the first dielectric layer;

step 4: filling a first epitaxial layer in the first groove to raise the bottom surface of the first groove to be in flush with the maximum stress position of the embedded epitaxial layer; and step 5: sequentially forming a gate dielectric layer and a gate conducting material layer, the embedded gate structure comprising a structure formed by superposing the gate dielectric layer and the gate conducting material layer, wherein the embedded gate structure is divided into an embedded part embedded in the semiconductor substrate and a protruding part located on a surface of the semiconductor substrate; the embedded part of the embedded gate structure consists of the gate dielectric layer formed on the bottom surface and the side surfaces of the first groove and the gate conducting material layer filled in the first groove, and the protruding part of the embedded gate structure is formed by the gate dielectric layer and the gate conducting material layer extending from the first groove to the surface of the semiconductor substrate;

a channel region is formed below the bottom surface of the embedded gate structure, and the surface of the channel region covered by the bottom surface of the embedded gate structure is used to form a channel; and the embedded epitaxial layer is used to provide stress for the channel region, and a structure that the bottom surface of the embedded gate structure is in flush with the maximum stress position of the embedded epitaxial layer enables the channel region to be subjected to a maximum stress and mobility of channel carriers to be improved.

8. The method for manufacturing the semiconductor device according to claim 7, wherein the semiconductor substrate is a silicon substrate.

9. The method for manufacturing the semiconductor device according to claim 7, wherein after step 5 is completed, the method for manufacturing the semiconductor device further comprises the following steps:

forming sidewalls on two sides of the protruding part of the embedded gate structure; and performing source and drain implantation in the forming area of the source region and the drain region on the two sides of the embedded gate structure to form the source region and the drain region.

10. The method for manufacturing the semiconductor device according to claim 7, wherein the semiconductor device is a PMOS transistor and a material of the embedded epitaxial layer is SiGe.

11. The method for manufacturing the semiconductor device according to claim 7, wherein a cross section of the first groove is rectangular.

12. The method for manufacturing the semiconductor device according to claim 7, wherein a material of the gate dielectric layer is silicon oxide; or the material of the gate dielectric layer is silicon oxynitride; or the material of the gate dielectric layer comprises a high-dielectric-constant material, and the high-dielectric-constant material comprises hafnium dioxide;

the material of the gate conducting material layer is polysilicon; or the material of the gate conducting material layer is metal.

\* \* \* \* \*